(12) United States Patent
Kim

(10) Patent No.: US 9,153,767 B2
(45) Date of Patent: Oct. 6, 2015

(54) ULTRASONIC PROBE AND MANUFACTURING METHOD THEREOF

(71) Applicant: SAMSUNG ELECTRONICS CO., LTD., Suwon-si (KR)

(72) Inventor: Dong Hyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 384 days.

(21) Appl. No.: 13/713,071

(22) Filed: Dec. 13, 2012

(65) Prior Publication Data

US 2013/0147318 A1    Jun. 13, 2013

(30) Foreign Application Priority Data

Dec. 13, 2011   (KR) ................. 10-2011-0133372

(51) Int. Cl.
| | | |
|---|---|---|
| *H01L 41/00* | (2013.01) | |
| *H01L 41/22* | (2013.01) | |
| *H01L 41/09* | (2006.01) | |
| *H01L 41/31* | (2013.01) | |
| *G10K 11/00* | (2006.01) | |

(52) U.S. Cl.
CPC ............. *H01L 41/09* (2013.01); *G10K 11/002* (2013.01); *H01L 41/31* (2013.01); *Y10T 29/42* (2015.01)

(58) Field of Classification Search
CPC ........ H04R 17/00; B06B 1/06; B06B 1/0625; H03H 9/09
USPC ......... 310/322, 326, 327, 334, 335; 26/29.35; 25/29.35

See application file for complete search history.

(56) References Cited

U.S. PATENT DOCUMENTS

| | | | |
|---|---|---|---|
| 5,091,893 A * | 2/1992 | Smith et al. ................... | 367/153 |
| 6,258,034 B1 | 7/2001 | Hanafy | |
| 7,348,712 B2 * | 3/2008 | Ogawa et al. ................. | 310/334 |
| 2013/0281857 A1 * | 10/2013 | Ko et al. ....................... | 600/443 |

* cited by examiner

*Primary Examiner* — Thomas Dougherty
(74) *Attorney, Agent, or Firm* — Sughrue Mion, PLLC

(57) ABSTRACT

Disclosed herein are an ultrasonic probe having a backing layer formed of a structure which varies acoustic impedance and a manufacturing method thereof. The ultrasonic probe includes a piezoelectric layer and a backing layer provided on a rear surface of the piezoelectric layer, and the backing layer includes a plurality of kerfs formed on a front surface thereof in a lengthwise direction, the front surface being adjacent to the rear surface of the piezoelectric layer, and the kerfs are formed such that the intervals between the kerfs are varied.

19 Claims, 8 Drawing Sheets

FIG.. 5

ULTRASONIC PROBE AND MANUFACTURING METHOD THEREOF

CROSS-REFERENCE TO RELATED APPLICATION

This application claims the benefit of Korean Patent Application No. 2011-0133372, filed on Dec. 13, 2011 in the Korean Intellectual Property Office, the disclosure of which is incorporated herein by reference in its entirety.

BACKGROUND

1. Field

Exemplary embodiments relate to an ultrasonic probe having a backing layer which varies acoustic impedance and a manufacturing method thereof.

2. Description of the Related Art

An ultrasonic diagnosis apparatus irradiates an ultrasonic signal toward a target region of the interior of a body of an object from the surface of the body of the object, and acquires an image regarding soft tissue tomography or a blood stream through a non-invasive technique using information of a reflected ultrasonic signal (an ultrasonic echo signal).

The ultrasonic diagnosis apparatus is small and inexpensive, executes display in real time and has a high safety level without radiation exposure, as compared to other image diagnosis apparatuses, such as an X-ray diagnosis apparatus, an X-ray computerized tomography (CT) scanner, a magnetic resonance imager (MRI) and a nuclear medicine diagnosis apparatus, and is thus widely used for heart diagnosis, celiac diagnosis, urinary diagnosis and obstetrical diagnosis.

Particularly, the ultrasonic diagnosis apparatus includes an ultrasonic probe which transmits an ultrasonic signal to an object and which receives an ultrasonic echo signal reflected by the object to acquire an ultrasonic image of the object.

The ultrasonic probe includes a piezoelectric layer in which a piezoelectric material vibrates to execute conversion between an electrical signal and an acoustic signal, a matching layer which reduces an acoustic impedance difference between the piezoelectric layer and the object so as to maximally transmit ultrasonic waves generated from the piezoelectric layer to the object, a lens which concentrates ultrasonic waves proceeding in the forward direction of the piezoelectric layer on a specific point, and a backing layer which prevents ultrasonic waves from proceeding in the backward direction of the piezoelectric layer to prevent image distortion.

The lens has a convex structure in the outward direction so as to concentrate ultrasonic waves, and such a structure attenuates the intensity of ultrasonic waves. Particularly, the intensity of ultrasonic waves at the central region of the lens requiring a high output is more reduced than the intensity of ultrasonic waves at the side regions of the lens.

SUMMARY

Therefore, it is an aspect of the exemplary embodiments to provide an ultrasonic probe having a backing layer of a structure which varies acoustic impedance and a manufacturing method thereof.

Additional aspects of the exemplary embodiments will be set forth in part in the description which follows and, in part, will be obvious from the description, or may be learned by practice of the exemplary embodiments.

In accordance with an aspect of the exemplary embodiments, an ultrasonic probe includes a piezoelectric layer, and a backing layer provided on a rear surface of the piezoelectric layer, wherein the backing layer includes a plurality of kerfs formed on a front surface thereof in a lengthwise direction, the front surface being adjacent to the rear surface of the piezoelectric layer, and the kerfs may be formed such that the intervals between the kerfs are increased in a direction from a central region of the backing layer to both side regions of the backing layer.

The plurality of kerfs may be formed such that the widths of the kerfs are decreased in a direction from a central region of the backing layer to both side regions of the backing layer.

The widths of the kerfs may be 2 mm or less.

The depths of the kerfs may be 1 mm or less.

In accordance with another aspect of the exemplary embodiments, a manufacturing method of an ultrasonic probe includes forming a plurality of kerfs on a surface of a backing material, and forming a piezoelectric layer on the surface of the backing material on which the plurality of kerfs is formed, wherein the plurality of kerfs is formed such that the intervals between the kerfs are increased in a direction from a central region of the backing material to both side regions of the backing material.

The plurality of kerfs may be formed such that the widths of the kerfs are decreased in a direction from the central region of the backing material to both side regions of the backing material.

The widths of the kerfs may be 2 mm or less.

The depths of the kerfs may be 1 mm or less.

The manufacturing method may further include forming a matching layer on a front surface of the piezoelectric layer, the front surface being opposite the surface on which the plurality of kerfs is formed, and installing an acoustic lens on the front surface of the matching layer.

In accordance with another aspect of the exemplary embodiments, an ultrasonic probe includes a piezoelectric layer which generates ultrasonic waves, a lens disposed on one side of the piezoelectric layer which focuses the ultrasonic waves on a target, and a backing layer disposed on another side of the piezoelectric layer opposite the one side, the backing layer reflecting a portion of the ultrasonic waves towards the target, wherein a density of the backing layer is varied according to a shape of the lens.

BRIEF DESCRIPTION OF THE DRAWINGS

These and/or other aspects of the exemplary embodiments will become apparent and more readily appreciated from the following description of the exemplary embodiments, taken in conjunction with the accompanying drawings of which.

DETAILED DESCRIPTION

Figure 1:
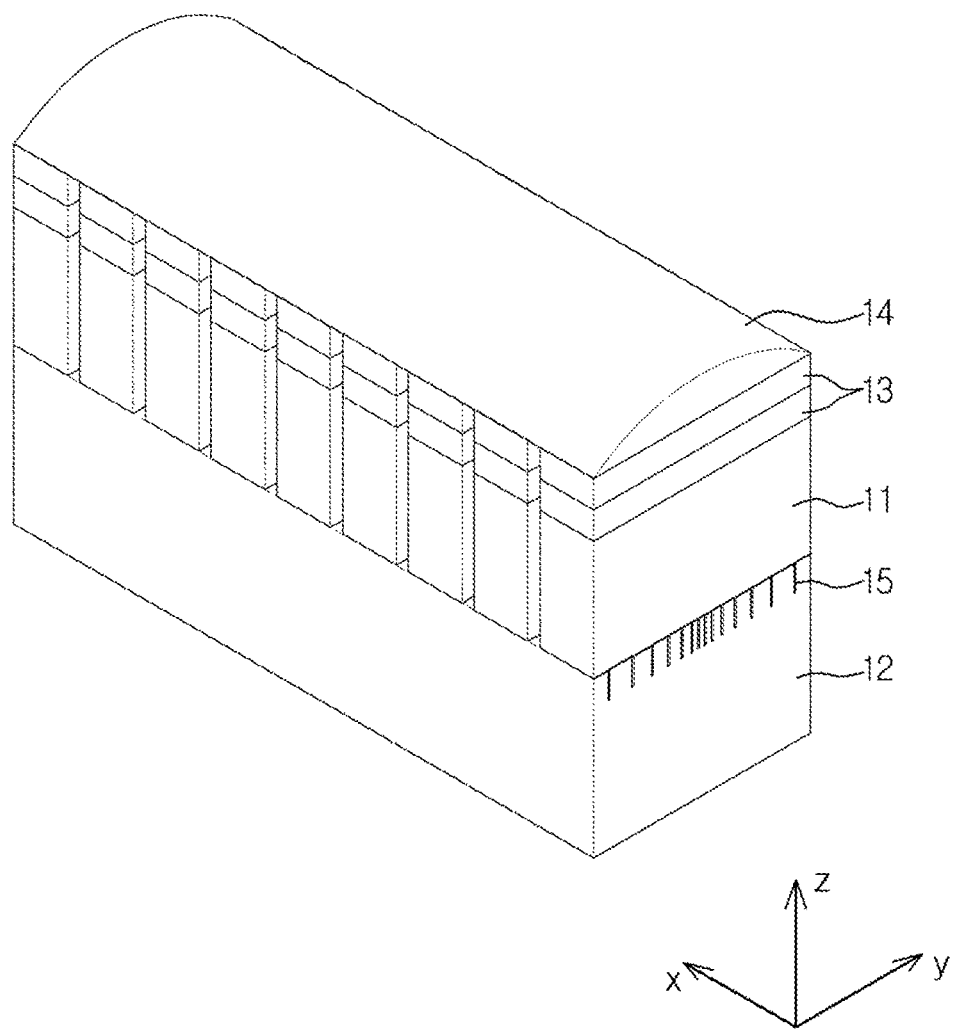
FIG. 1 is a perspective view of an ultrasonic probe in accordance with an exemplary embodiment.

Reference will now be made in detail to the exemplary embodiments, examples of which are illustrated in the accompanying drawings, wherein like reference numerals refer to like elements throughout.

Figure 2:
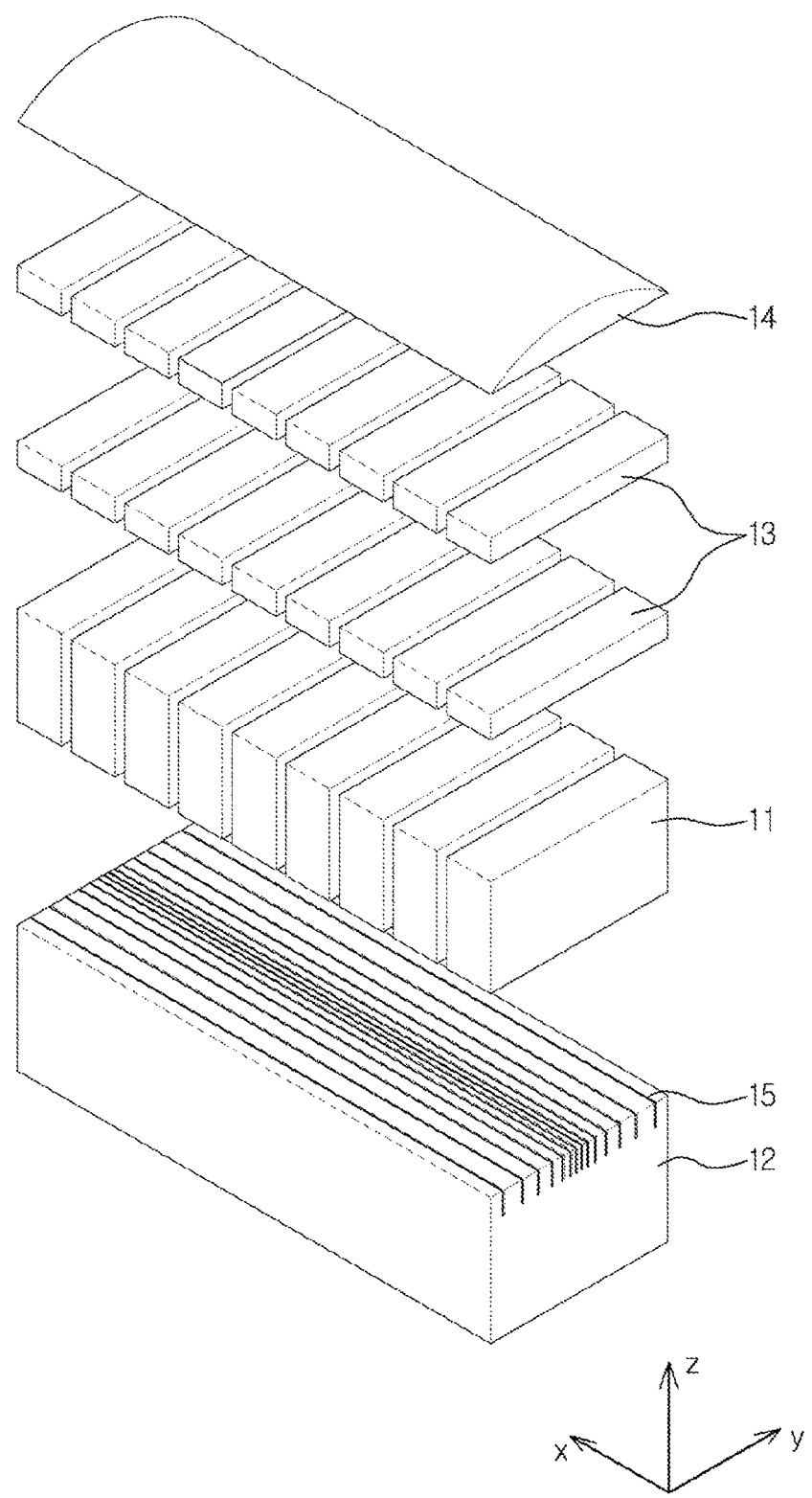
FIG. 2 is an exploded perspective view of the ultrasonic probe in accordance with the exemplary embodiment.
Figure 3:
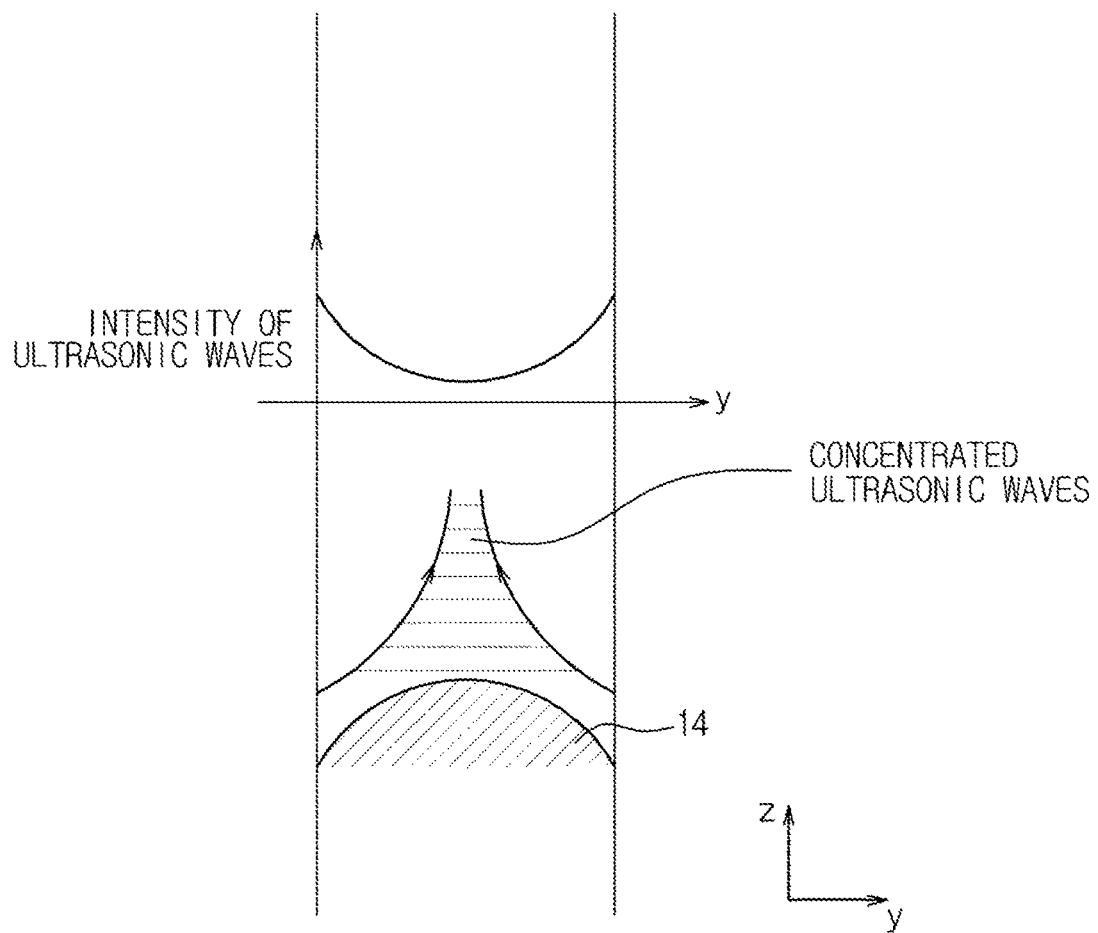
FIG. 3 is a graph illustrating the intensity of ultrasonic waves radiated from the ultrasonic probe and the concentrating aspect of the ultrasonic waves.

FIG. 1 is a perspective view of an ultrasonic probe in accordance with an exemplary embodiment, FIG. 2 is an exploded perspective view of the ultrasonic probe in accordance with the exemplary embodiment, and FIG. 3 is a graph illustrating the intensity of ultrasonic waves radiated from the ultrasonic probe and the concentrating aspect of the ultrasonic waves.

An ultrasonic probe in accordance with an exemplary embodiment includes a piezoelectric layer 11, matching layers 13 provided on the front surface of the piezoelectric layer, a lens 14 provided on the front surface of the matching layer 13, and a backing layer 12 provided on the rear surface of the piezoelectric layer.

An effect in which, when mechanical pressure is applied to a designated material, voltage is generated, and an effect in which, when voltage is applied, a mechanical deformation occurs, are respectively referred to as the piezoelectric effect and the inverse piezoelectric effect, and a material exhibiting such effects is referred to as a piezoelectric material. That is, the piezoelectric material is a material which converts electrical energy into mechanical vibration energy or converts mechanical vibration energy into electrical energy.

The ultrasonic probe in accordance with the exemplary embodiment includes the piezoelectric layer 11 which receives an electrical signal and converts the electrical signal into mechanical vibration to generate ultrasonic waves.

The piezoelectric material forming the piezoelectric layer 11 may include PZMT crystals formed of a solid solution of lead zirconate titanate (PZT) ceramic, lead magnesium niobate and lead titanate, or PZNT crystals formed of a solid solution of lead zinc niobate and lead titanate.

The matching layers 13 are provided on the front surface of the piezoelectric layer 11, and reduce an acoustic impedance difference between the piezoelectric layer 11 and an object so that ultrasonic waves generated from the piezoelectric layer 11 are effectively transmitted to the object. Although FIG. 1 shows two matching layers 13, more or less than two matching layers 13 may be provided according to other exemplary embodiments. For example, one matching layer 13 may be provided, three matching layers 13 may be provided, etc.

The matching layers 13 and the piezoelectric layer 11 may be divided into plural units having a designated width by a dicing process.

Although not shown in the drawings, a protective layer may be provided on the front surface of the matching layer 13. The protective layer may prevent leakage of a high-frequency component generated in the piezoelectric layer 11 to the outside and block inflow of an external high-frequency signal. Further, the protective layer may be formed by coating or depositing a conductive material on the surface of a film having high moisture resistance and high chemical resistance, and may thus protect internal parts from water or chemical agents used in disinfection.

The lens 14 is provided on the front surface of the matching layer 13. According to an exemplary embodiment, the lens 14 has a convex shape in the radiation direction of ultrasonic waves so as to concentrate the ultrasonic waves towards a target object, but according to other exemplary embodiments, the lens 14 may have a concave shape, for example, in situations when the speed of sound is lower than as in the human body.

The backing layer 12 is provided on the rear surface of the piezoelectric layer 11. The backing layer 12 absorbs ultrasonic waves generated from the piezoelectric layer 11 and blocks ultrasonic waves proceeding in the backward direction (downward along the z-axis in FIG. 1) of the piezoelectric layer 11, thus preventing image distortion. In order to improve performance considering the effects of ultrasonic wave attenuation and/or the blocking effect, the backing layer 12 may be manufactured in a multi-layered structure.

Ultrasonic waves generated due to vibration of the piezoelectric layer 11 proceed in a direction toward the object and proceed in a direction toward the backing layer 12, i.e., in the backward direction. A part of ultrasonic waves reaching the backing layer 12 is reflected and proceeds again in the direction toward the object, and another part of the ultrasonic waves reaching the backing layer 12 passes through the backing layer 12 and is absorbed by the backing layer 12.

In general, in order to concentrate ultrasonic waves, the lens 14 having the convex shape in the proceeding direction of the ultrasonic waves is used, as described above. With reference to FIG. 3, such a lens 14 concentrates ultrasonic waves but attenuates the intensity of the ultrasonic waves. Particularly, ultrasonic waves radiated from the central region of the lens 14 are more attenuated than ultrasonic waves radiated from the side regions of the lens 14. When the intensity of ultrasonic waves radiated from the side regions of the lens 14 is higher than the intensity of ultrasonic waves radiated from the central region of the lens 14, generation of side lobe increases.

From the graph of FIG. 3, it is understood that the intensity of ultrasonic waves discharged from the central region of the lens 14 is lower than the intensity of ultrasonic waves discharged from the side regions of the lens 14 due to attenuation of ultrasonic waves by the lens 14.

That is, attenuation of ultrasonic waves due to the structure of the lens 14, particularly, attenuation of ultrasonic waves discharged from the central region of the lens 14, lowers ultrasonic wave concentrating efficiency.

Figure 7:
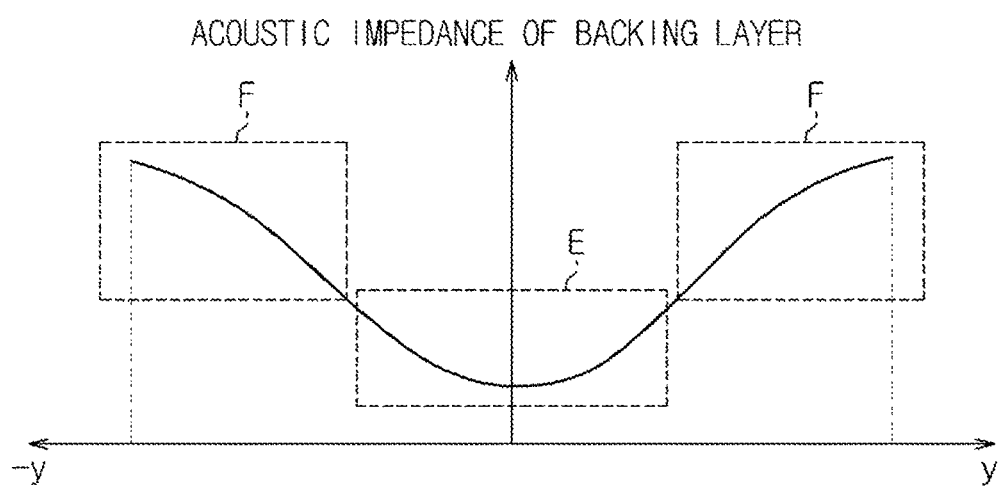
FIG. 7 is a graph illustrating acoustic impedance of the backing layer in accordance with the exemplary embodiment.

In order to solve this problem, the ultrasonic probe in accordance with the exemplary embodiment forms a plurality of kerfs 15 on the front surface of the backing layer 12 contacting the piezoelectric layer 11 such that acoustic impedance of the backing layer 12 has an aspect shown in FIG. 7, and thus the central region of the backing layer 12 reflects a large amount of ultrasonic waves and the side regions of the backing layer reflect a relatively small amount of ultrasonic waves so as to compensate for the intensity of discharged ultrasonic waves. The detailed description of formation of the kerfs 15 on the backing layer 12 will be given below with reference to description of the structure of the kerfs 15.

Figure 4:
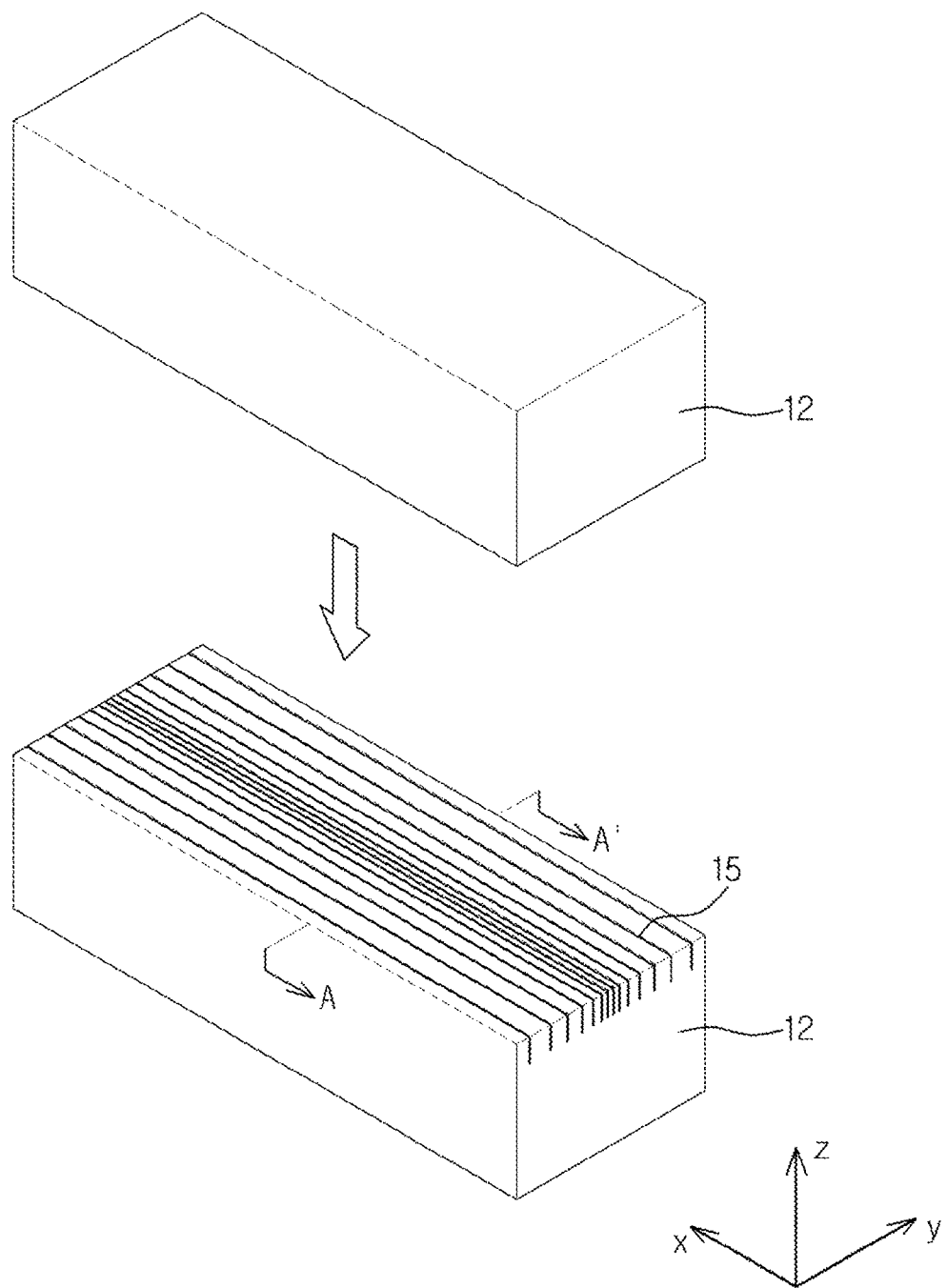
FIG. 4 is a view illustrating the formation of kerfs on a backing layer in accordance with the exemplary embodiment.
Figure 5:
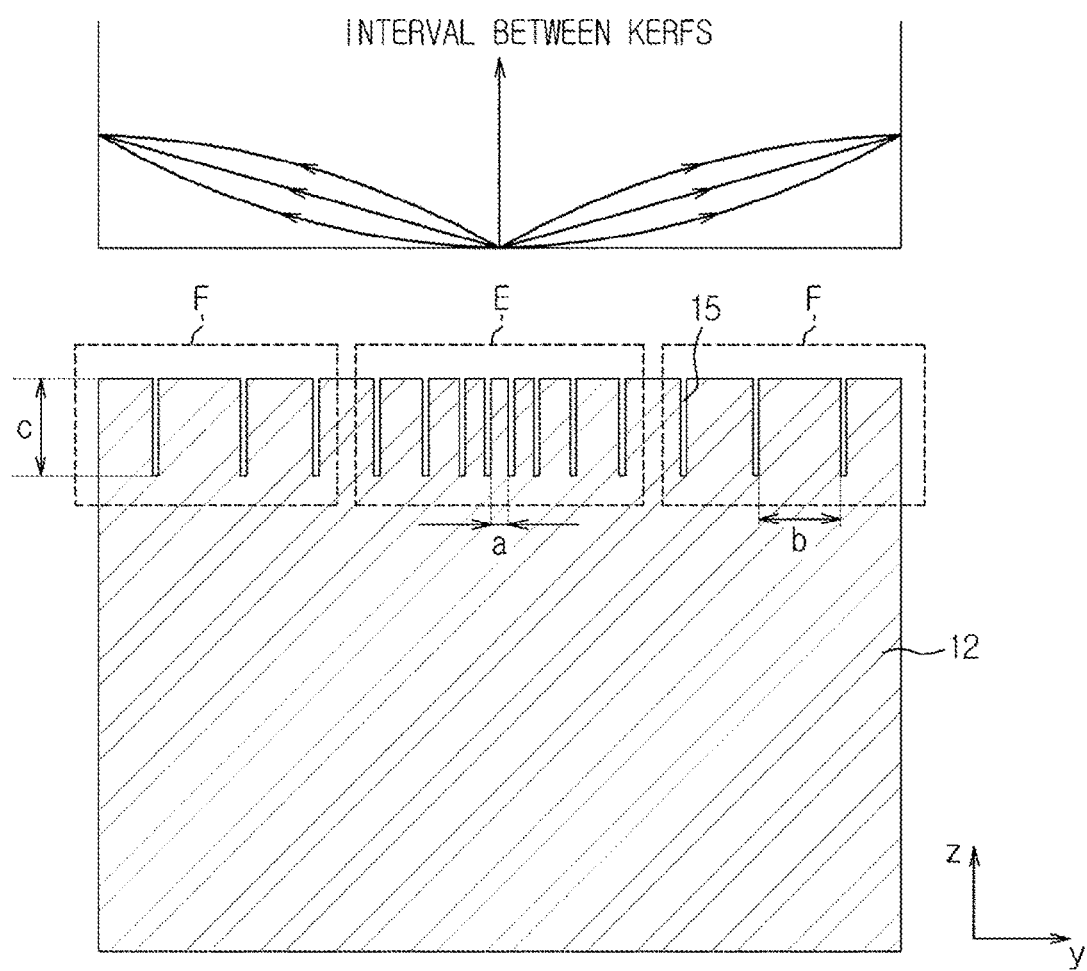
FIG. 5 is a cross-sectional view of the backing layer in accordance with the exemplary embodiment, taken along the line A-A' of FIG. 4.
Figure 6:
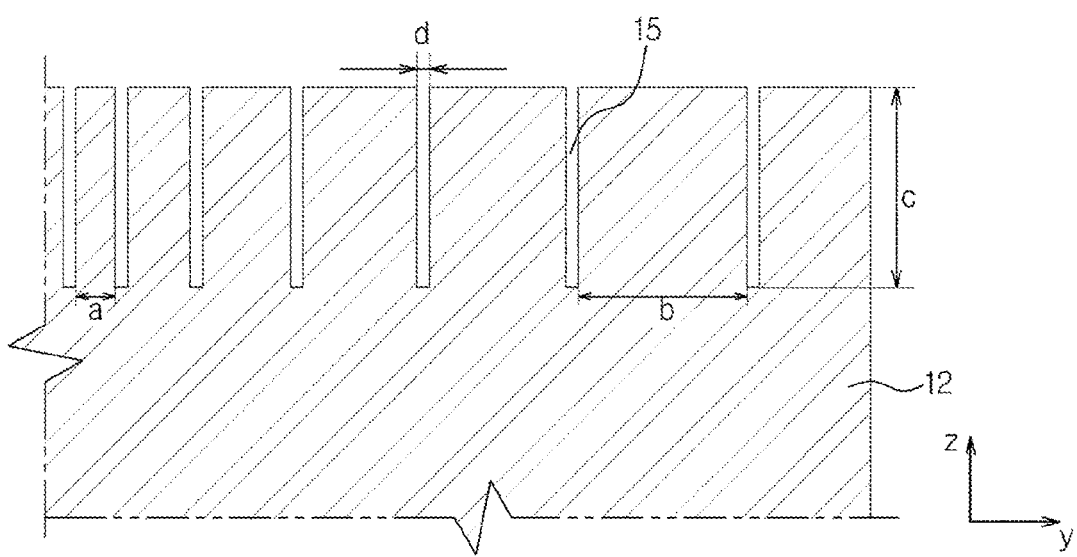
FIG. 6 is an enlarged view of the structure of the kerfs on the backing layer in accordance with the exemplary embodiment.

FIG. 4 is a view illustrating formation of the kerfs on the backing layer in accordance with the exemplary embodiment, FIG. 5 is a cross-sectional view of the backing layer in accordance with the exemplary embodiment, taken along the line A-A' of FIG. 4, and FIG. 6 is an enlarged view of the structure of the kerfs on the backing layer in accordance with the exemplary embodiment.

A plurality of kerfs 15 is formed on the front surface of the backing layer 12, i.e., the surface of the backing layer 12 contacting the piezoelectric layer 11.

The kerfs 15 are formed on one surface of a material used as the backing layer 12 through a dicing process, and when the kerfs 15 are formed, the piezoelectric layer 11 is stacked on the surface of the backing layer 12 on which the kerfs 15 are formed.

The kerfs 15 are extended in the lengthwise direction of the backing layer 12. Here, the lengthwise direction refers to an X-axis direction, as shown in the drawings.

Through the dicing process, the kerfs 15 may be formed such that the depth c of the kerfs 15 has a predetermined value, and according to an exemplary embodiment, the depth c of the kerfs 15 may be 1 mm or less, although is not limited thereto according to other exemplary embodiments.

Further, according to an exemplary embodiment, the width d of the kerfs 15 may have a predetermined value, and the width d of the kerfs 15 may be 2 mm or less, although is not limited thereto according to other exemplary embodiments.

As shown in FIGS. 5 and 6, the kerfs 15 formed on the backing layer 12 are formed such that the intervals between the kerfs 15 are increased in the +Y and −Y directions in relation to the central region E. The interval between the kerfs 15 may be increased in various aspects, as shown in the graph of FIG. 5.

As indicated by a comparison between the interval a between the kerfs 15 formed at the central region E and the interval b between the kerfs 15 formed at the side regions F, the interval b between the kerfs 15 formed at the side regions F is greater than the interval a between the kerfs 15 formed at the central region E.

When the kerfs 15 are formed under the condition that there is such an interval difference, i.e., that the kerfs 15 are formed intensely at the central region E and formed sparsely at the side regions F, the density of a backing material forming the backing layer 12 at the central region E becomes lower than the density of the backing material forming the backing layer 12 at the side regions F.

That is, on the assumption that a region of a designated size is given, when the number of kerfs formed in the region is large, the area of the backing material occupying the region is reduced due to the large number of kerfs and thus the density of the backing material is lowered, and, when the number of the kerfs formed in the region is small, the area of the backing material occupying the region is almost equal to the area of the backing material when there are no kerfs, and thus the density of the backing material is relatively higher than the density of the backing material when the number of the kerfs is large.

In case of plane progressive waves, such as ultrasonic waves, acoustic impedance may be expressed by multiplication of the density of a medium to which ultrasonic waves are applied and the speed of sound.

Accordingly, as the density of the medium decreases, acoustic impedance is reduced.

Therefore, acoustic impedance at the central region E, where the kerfs 15 are intensely disposed and thus the density of the backing material is lowered, is decreased.

On the other hand, acoustic impedance at the side regions F, where the kerfs are sparsely disposed and thus the density of the backing material is relatively higher than the central region E, is relatively increased.

In comparison with ultrasonic waves which proceed from a medium having high acoustic impedance, when ultrasonic waves proceed from a medium having low acoustic impedance, the intensity of reflected ultrasonic waves is increased as an acoustic impedance difference with the piezoelectric layer 11 increases.

At the central region E of the backing layer 12 where acoustic impedance is decreased, as described above, an acoustic impedance difference between the central region E and the piezoelectric layer 11 increases.

Therefore, from among ultrasonic waves incident upon the central region E of the backing layer 12, the rate of ultrasonic waves reflected in the direction to the object is increased.

At the side regions of the backing layer 12 where acoustic impedance is relatively increased, an acoustic impedance difference with the piezoelectric layer 11 relatively decreases.

Therefore, from among ultrasonic waves incident upon the side regions F of the backing layer 12, the rate of ultrasonic waves reflected in the direction to the object is decreased.

Thereby, from among ultrasonic waves radiated to the object, the intensity of ultrasonic waves at the central region E occupying a large part of ultrasonic waves concentrated by the lens 14 is supplemented by ultrasonic waves reflected by the central region of the backing layer 12, thus solving the above-described problem.

As described above, the acoustic impedance on the backing layer 12, which is formed of a material initially having a single acoustic impedance, may be varied by adjusting the intervals between the kerfs 15. By adjusting the width of the kerfs 15 together with adjustment of the intervals between the kerfs 15, a degree of variation of acoustic impedance may be increased.

That is, the kerfs 15 formed on the backing layer 12 may be formed such that the width of the kerfs 15 is decreased in the +Y and −Y directions from the central region E.

When the width of the kerfs 15 formed at the central region E is increased, the density of the backing material is lowered in comparison to when if the width of the kerfs 15 is not changed, and when the width of the kerfs 15 formed at the side regions is decreased, the density of the backing material is raised in comparison to when the width of the kerfs 15 is not changed. Therefore, acoustic impedance at the central region E decreases and acoustic impedance at the side regions F is relatively increased.

For example, on the assumption that a predetermined number of kerfs 15 is formed on one surface of the backing material, acoustic impedance may be varied by adjusting the intervals between the kerfs 15, as described above, and a degree of variation of acoustic impedance may be increased by adjusting the widths of the kerfs 15, as described above.

FIG. 7 is a graph illustrating acoustic impedance of the backing layer 12 in accordance with the exemplary embodiment.

When the intervals between the kerfs 15 formed on the backing layer 12 are adjusted, as described above, acoustic impedance of the backing layer 12 is decreased at the central region E of the backing layer 12 and is increased at the side regions F of the backing layer 12, as shown in FIG. 7, and thus desired effects may be obtained.

Figure 8:
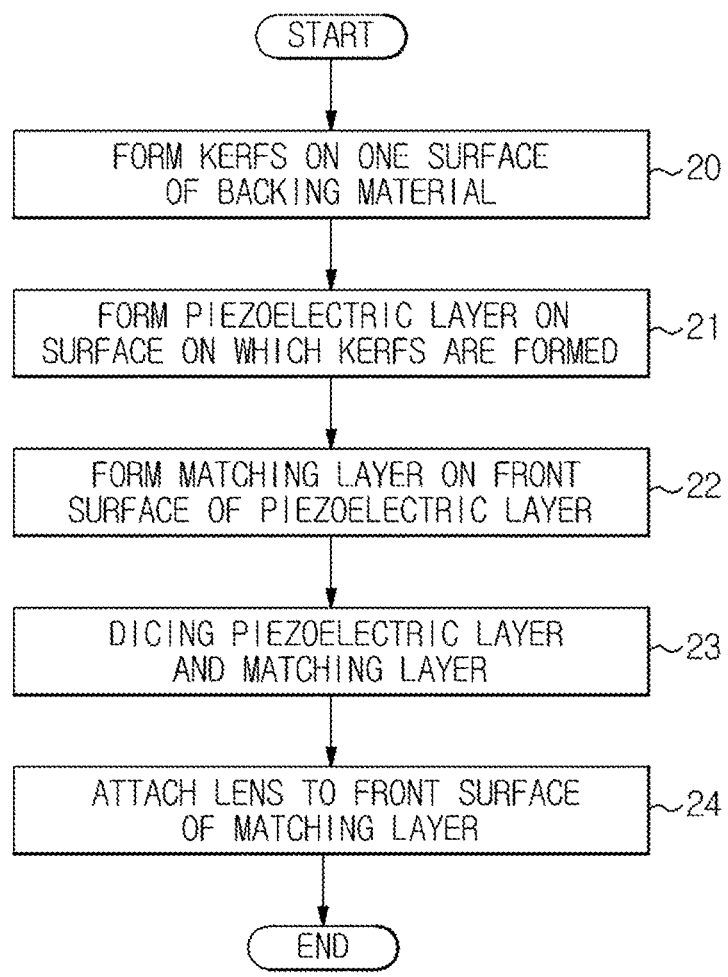
FIG. 8 is a flowchart illustrating a manufacturing method of the ultrasonic probe in accordance with another exemplary embodiment.

FIG. 8 is a flowchart illustrating a manufacturing method of the ultrasonic probe in accordance with another exemplary embodiment.

With reference to FIG. 8, first, kerfs are formed on one surface of a backing material at Operation 20.

The kerfs may be formed on one surface of the backing material through a dicing process.

The kerfs are extended in the lengthwise direction of the backing material. Here, the lengthwise direction refers to an X-axis direction, as shown in FIG. 2.

Through the dicing process, the kerfs may be formed such that the depth c of the kerfs has a predetermined value, and the depth c of the kerfs may be 1 mm or less. Further, the kerfs may be formed such that the width d of the kerfs may have a predetermined value, and the width d of the kerfs may be 2 mm or less.

Further, the kerfs may be formed such that the intervals between the kerfs is increased in the +Y and −Y directions from a central region. That is, the kerfs may be intensely disposed at the central region and be sparsely disposed at both side regions.

Further, the kerfs may be formed such that the width of the kerfs is decreased in the +Y and −Y directions from the central region. That is, the width of the kerfs formed at the central region may be greater than the width of the kerfs formed at both side regions.

After the kerfs are formed on the backing material, a piezoelectric material is attached to the surface of the backing material on which the kerfs are formed, thus forming a piezoelectric layer at Operation 21.

The piezoelectric material forming the piezoelectric layer may include PZMT crystals formed of a solid solution of lead zirconate titanate (PZT) ceramic, lead magnesium niobate and lead titanate, or PZNT crystals formed of a solid solution of lead zinc niobate and lead titanate.

After formation of the piezoelectric layer, a process of forming a matching layer on the front surface of the piezoelectric material is performed at Operation 22, a process of dividing the piezoelectric layer and the matching layer into plural units through a dicing process is performed at Operation 23, and a process of attaching a lens to the front surface of the matching layer is performed at Operation 24.

As is apparent from the above description, an ultrasonic probe in accordance with exemplary embodiments may vary acoustic impedance throughout the entirety of a backing layer even when the backing layer is formed of a material initially having a single acoustic impedance, and may thus suppress generation of side lobe of an ultrasonic beam. Furthermore, it is understood that other techniques (e.g., forming shapes other than kerfs, etc.) may be used instead of or in addition to the exemplary embodiments described above to vary the density of the backing layer, according to other exemplary embodiments.

Although a few exemplary embodiments have been shown and described, it would be appreciated by those skilled in the art that changes may be made in these exemplary embodiments without departing from the principles and spirit of the exemplary embodiments, the scope of which is defined in the claims and their equivalents.

What is claimed is:

1. An ultrasonic probe comprising:
    a piezoelectric layer; and
    a backing layer provided on a rear surface of the piezoelectric layer,
    wherein the backing layer includes a plurality of kerfs formed on a front surface thereof in a lengthwise direction, the front surface being adjacent to the rear surface of the piezoelectric layer, and the kerfs are formed such that the intervals between the kerfs are varied.

2. The ultrasonic probe according to claim 1, wherein the plurality of kerfs is formed such that the intervals between the kerfs are increased in a direction from a central region of the backing layer to both side regions of the backing layer.

3. The ultrasonic probe according to claim 1, wherein the plurality of kerfs are formed such that widths of the kerfs are decreased in a direction from a central region of the backing layer to both side regions of the backing layer.

4. The ultrasonic probe according to claim 3, wherein the widths of the kerfs are 2 mm or less.

5. The ultrasonic probe according to claim 1, wherein the depths of the kerfs are 1 mm or less.

6. A manufacturing method of an ultrasonic probe comprising:
    forming a plurality of kerfs on a surface of a backing material; and
    forming a piezoelectric layer on the surface of the backing material on which the plurality of kerfs is formed,
    wherein the plurality of kerfs is formed such that intervals between the kerfs are varied.

7. The manufacturing method according to claim 6, wherein the plurality of kerfs is formed such that the intervals between the kerfs are increased in a direction from a central region of the backing material to both side regions of the backing material.

8. The manufacturing method according to claim 6, wherein the plurality of kerfs is formed such that widths of the plurality of kerfs are decreased in a direction from the central region of the backing material to both side regions of the backing material.

9. The manufacturing method according to claim 8, wherein the widths of the kerfs are 2 mm or less.

10. The manufacturing method according to claim 6, wherein the depths of the kerfs are 1 mm or less.

11. The manufacturing method according to claim 6, further comprising:
    forming a matching layer on a front surface of the piezoelectric layer, the front surface being opposite the surface on which the plurality of kerfs is formed; and
    installing an acoustic lens on the front surface of the matching layer.

12. An ultrasonic probe comprising:
    a piezoelectric layer which generates ultrasonic waves;
    a lens disposed on one side of the piezoelectric layer which focuses the ultrasonic waves on a target; and
    a backing layer disposed on another side of the piezoelectric layer opposite the one side, the backing layer reflecting a portion of the ultrasonic waves towards the target,
    wherein a density of the backing layer is varied according to a shape of the lens, and
    wherein the density of the backing layer is varied by forming kerfs in the backing layer.

13. The ultrasonic probe according to claim 12, wherein the lens is convex, and the kerfs are formed such that spaces between the kerfs are shorter towards a central region of the backing layer and are longer towards side regions of the backing layer.

14. The ultrasonic probe according to claim 13, wherein the kerfs in the central region have a greater width than the kerfs in the side regions.

15. The ultrasonic probe according to claim 12, further comprising a matching layer disposed between the piezoelectric layer and the lens to reduce an acoustic impedance difference between the piezoelectric layer and the target.

16. The ultrasonic probe according to claim 12, wherein the density of the backing layer is varied to reduce the density of a portion of the backing layer corresponding to a thickest portion of the lens, in comparison to the density of portions of the backing layer corresponding to thinner portions of the lens, to thereby reduce acoustic impedence in the portion of the backing layer corresponding to the thickest portion.

17. The ultrasonic probe according to claim 12, wherein the piezoelectric layer comprises crystals formed of at least one of a solid solution of lead zirconate titanate (PZT) ceramic, lead magnesium niobate and lead titanate, or a solid solution of lead zinc niobate and lead titanate.

18. The ultrasonic probe according to claim 12, wherein widths of the kerfs are 2 mm or less.

19. The ultrasonic probe according to claim 12, wherein depths of the kerfs are 1 mm or less.

* * * * *